(12) United States Patent
Honer

(10) Patent No.: US 7,356,923 B2
(45) Date of Patent: Apr. 15, 2008

(54) RIGID FLEX INTERCONNECT VIA

(75) Inventor: Kenneth Allen Honer, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 29 days.

(21) Appl. No.: 11/293,440

(22) Filed: Dec. 2, 2005

(65) Prior Publication Data

US 2007/0124931 A1    Jun. 7, 2007

(51) Int. Cl.
*H01K 3/10* (2006.01)
*H01B 13/00* (2006.01)
*B23K 26/00* (2006.01)

(52) U.S. Cl. ............................. 29/852; 29/830; 29/846; 216/18; 219/121.71

(58) Field of Classification Search .................. 29/830, 29/846, 852; 216/18; 219/121.71
See application file for complete search history.

(56) References Cited

U.S. PATENT DOCUMENTS

| 4,642,160 | A | * | 2/1987 | Burgess | 216/18 |
| 5,282,312 | A | | 2/1994 | DiStefano et al. | |
| 5,367,764 | A | | 11/1994 | DiStefano et al. | |
| 5,868,950 | A | * | 2/1999 | Noddin | 216/18 |
| 5,910,255 | A | * | 6/1999 | Noddin | 216/18 |
| 6,021,564 | A | * | 2/2000 | Hanson | 29/852 |
| 6,023,041 | A | * | 2/2000 | Noddin | 219/121.71 |
| 6,103,992 | A | * | 8/2000 | Noddin | 219/121.71 |
| 6,203,891 | B1 | * | 3/2001 | Noddin | 428/209 |
| 7,057,133 | B2 | * | 6/2006 | Lei et al. | 219/121.71 |

* cited by examiner

*Primary Examiner*—C. J Arbes
(74) *Attorney, Agent, or Firm*—Lerner, David, Littenberg, Krumholz & Mentlik, LLP

(57) ABSTRACT

A rigid-flexible printed wire assembly which employs a blind via for interconnection is disclosed. Preferably, the assembly includes a rigid section having a through hole formed therethrough and a flexible section having an inner metal layer. Laser ablation is preferably utilized to form a blind via in the flexible section, while utilizing the through hole of the rigid section as a guide.

17 Claims, 3 Drawing Sheets

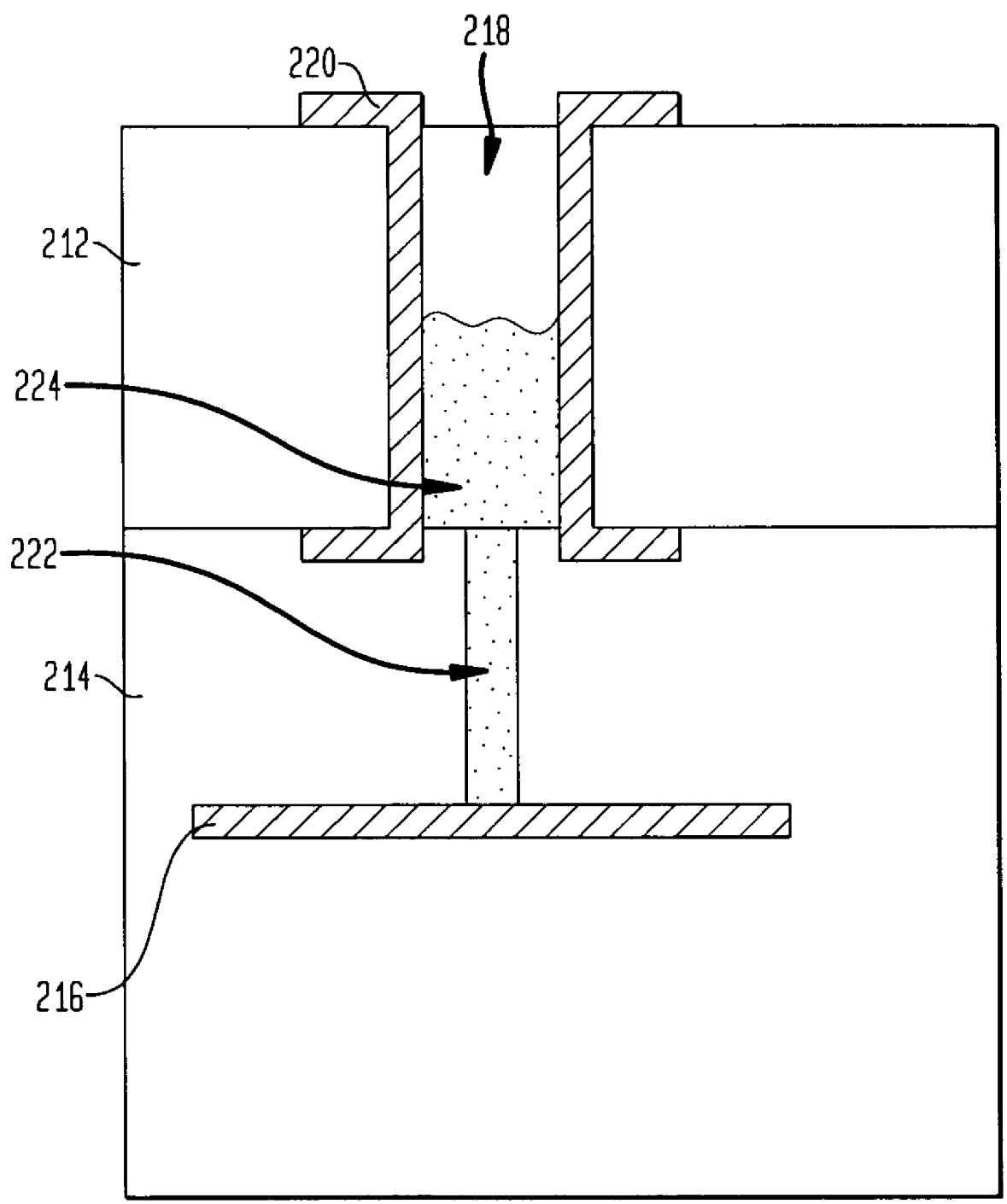

US 7,356,923 B2

RIGID FLEX INTERCONNECT VIA

BACKGROUND OF THE INVENTION

The present invention relates to connections between layers of a printed wiring board, and more particularly to the use of laser ablation in making such connections.

Connections between layers of a multi-layer printed wiring board are typically created by drilling holes through the dielectric layers so that the drilled holes intersect conductive traces on those layers to be connected, and then applying a metallic layer in the drilled holes, as by "seeding" or electrolessly plating the interior surfaces of the holes. In most cases, the drilled holes are through holes extending through all of the layers of the board, rather than blind vias. This has become a rather common practice because of the difficulties in controlling the depth of a drill used to create blind vias in the materials. For example, in rigid-flexible printed wiring boards where the rigid layers are constructed of materials such as glass reinforced epoxy and the flexible sections are constructed of thin layers of a dielectric such as polymide, it would be difficult to drill and stop at an inner metal layer in the flexible layer. Thus, through hole connections are commonly utilized.

However, through holes are rather large and occupy more board area on both sides, as well as on all intermediate layers of the assembly. This tends to reduce the achievable electronic density and tends to makes the overall package size larger. Clearly, one solution to this problem would be to make use of blind vias. Therefore, there exists a need for an improved method of forming blind vias, and particularly for forming blind vias as connections between rigid sections and flexible layers in rigid-flexible printed wiring boards.

SUMMARY OF THE INVENTION

A first aspect of the present invention is a method of forming a rigid-flexible printed wiring assembly. The method according to this aspect preferably includes the steps of providing a first section, the rigid section having a plated through hole formed therethrough, attaching a second section including one or more dielectric layers and a metal layer to the first section, and laser ablating a blind hole in through at least one dielectric layer of the second section to expose the inner metal layer. Preferably, the laser ablating step is performed through the through hole of the first section. The method may further include the step of plating the blind hole or depositing solder within the blind hole and the through hole. Further, the inner metal layer may be electrically connected to the through hole. In certain embodiments, the first section may be constructed of relatively rigid materials and the section may be constructed of flexible materials.

BRIEF DESCRIPTION OF THE DRAWINGS

A more complete appreciation of the subject matter of the present invention and the various advantages thereof can be realized by reference to the following detailed description in which reference is made to the accompanying drawings in which:

FIG. 3 is a cross-sectional view a rigid-flexible printed wiring board employing a blind view connection in accordance with another embodiment of the present invention.

DETAILED DESCRIPTION

Figure 1:
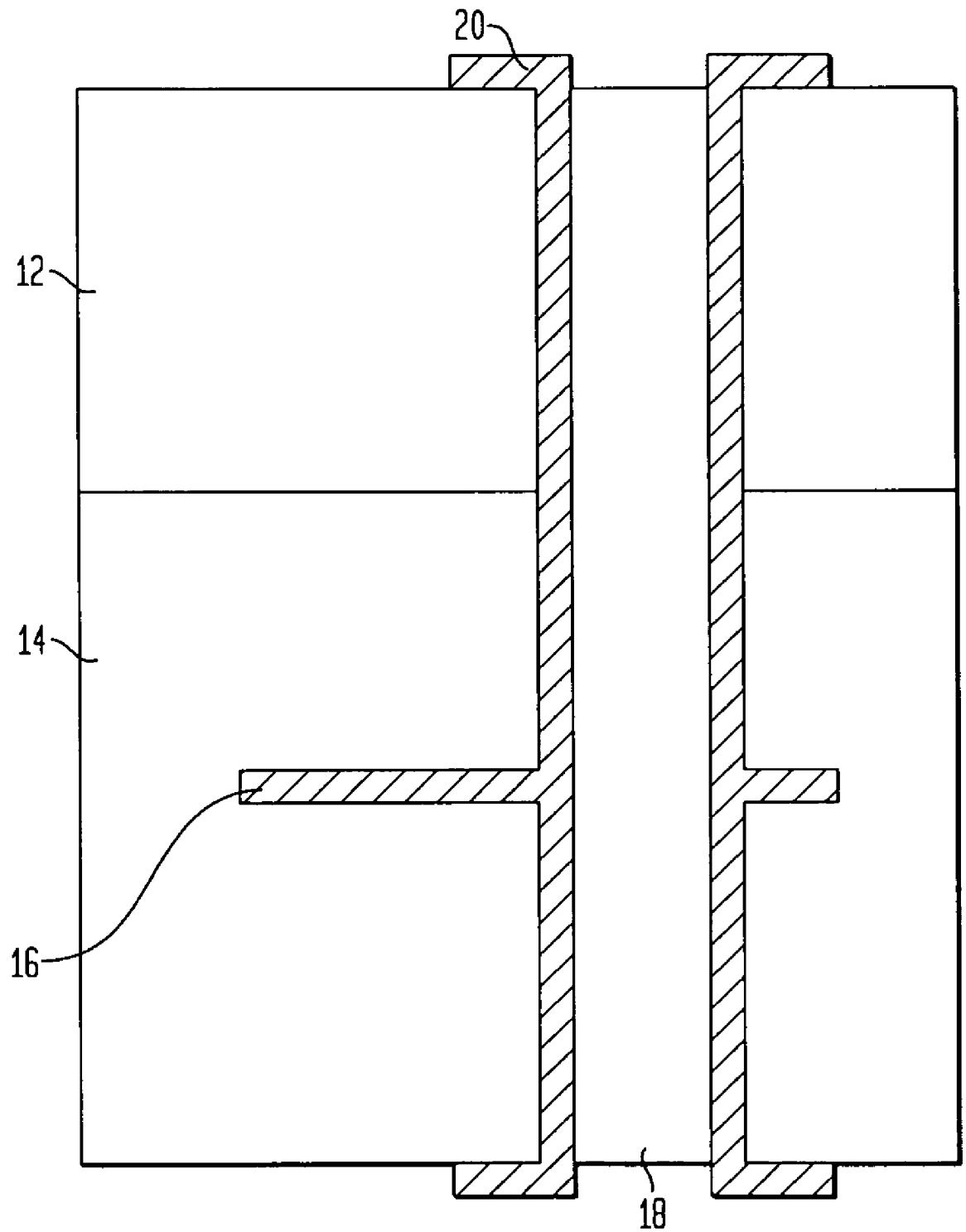
FIG. 1 is a cross sectional view of a prior art printed wiring board employing a through hole connection between sections.

A section of a prior art printed wiring board, package or assembly 10 is illustrated in FIG. 1. It is noted that the depiction shown in FIG. 1 is not to scale, and may be exaggerated for clarity purposes. This type of assembly 10 typically includes a first section 12 connected to a second section 14. The connection between these sections may be accomplished in many different fashions, but in one embodiment sections 12 and 14 are laminated together. It is to be understood that these sections may be formed of many different types of materials which are well known in the art for such purposes. As shown in FIG. 1, second section 14 also preferably includes an inner metal layer 16. A plated through hole 18 preferably extends between the two sections 12 and 14. Through hole 18 is also preferably plated along its walls with a material 20 such as copper or another metal suitable for forming a connection between, for example, inner metal layer 16 and traces or the like (not shown) disposed on or within first section 12. For example, where first section 12 includes plural dielectric layers and traces extending between the layers, or on exposed surfaces of the top or bottom layers, hole 18 typically intercepts one or more of these traces so that the conductive material 20 plated in the hole forms a connection between the traces of the first section and trace 16 of the second section. Of course, while only one hole is depicted in FIG. 1, a typical assembly will include numerous holes forming numerous interconnections as required to accomplish the desired circuit routing.

Typically, an assembly like assembly 10 shown in FIG. 1 is manufactured by first affixing together first section 12 and second section 14. This may be done by any of many well known methods, such as laminating. Thereafter, through hole 18 is preferably drilled through both sections 12 and 14, and also through a portion of inner metal layer 16. Finally, substantially all of the walls of through hole 18 are plated with conductive material 20. Some of material 20 is may be plated on the exterior surfaces of sections 12 and 14 (as shown in FIG. 1) so as to provide external connections for connecting to other components, such as traces and chips. This allows such components to be electrically connected to inner metal layer 16. All of these steps are well known and widely utilized by those of ordinary skill in the art.

However, as noted above, providing a single continuous through hole extending through both sections, like through hole 18 of FIG. 1, provides for a rather large assembly 10. Also, forming such holes by drilling and subsequently plating the entirety of each hole is costly, and requires that both sections be assembled prior to the drilling and plating operation.

Figure 2:
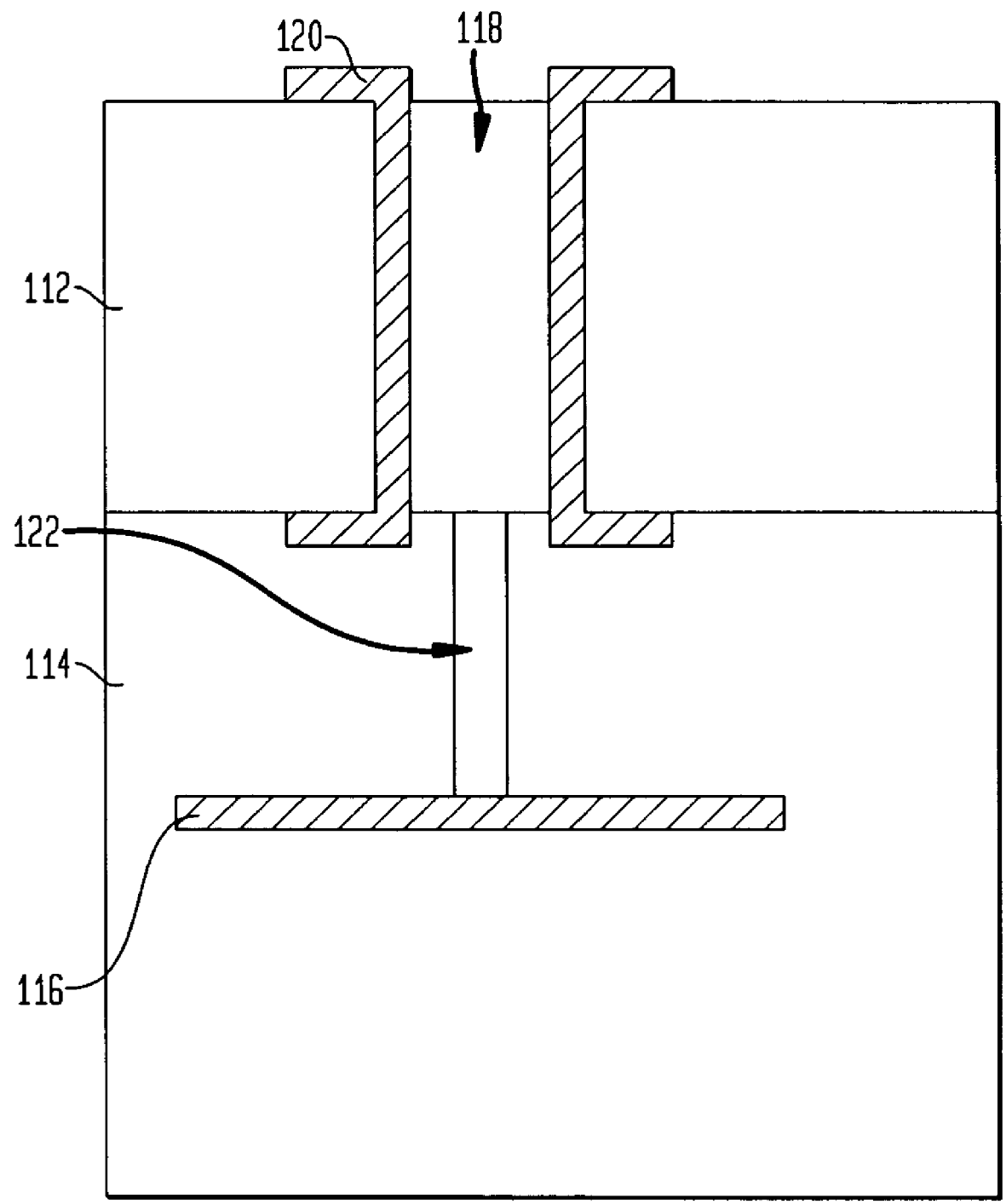
FIG. 2 is a cross sectional view of a rigid-flexible printed wiring board employing a blind via connection in accordance with one embodiment of the present invention.

A method of producing an assembly 110 according to one embodiment of the present invention is shown in FIG. 2. Once again, assembly 110 includes a first section 112 and a second section 114. First section 112 may be a rigid section including one or more dielectric layers such as fiber-reinforced dielectrics as, for example, fiberglass-epoxy materials such as FR-4, together with one or more layers of metallic traces. The second section 114 may be a flexible section which typically includes one or more dielectric layers and one or more layers of metallic features including a buried or inner metal layer 116.

As shown in FIG. 2, assembly 110 utilizes a through hole and blind via combination to electrically connect inner metal layer 116 to other components of the assembly. In this regard, rigid section 112 includes a through hole 118, that may be plated with a material 120. This through hole is preferably drilled in section 112 and plated with material 120 prior to it being connected to section 114. The preferred method of making through hole 116 is drilling, Subsequent to drilling through hole 118 in rigid section 112, the hole may be plated with material 120, by any common plating method known in the art. Stated another way, first or rigid section 112 can be formed by the conventional methods used to fabricate ordinary circuit boards with through holes.

With through hole 116 formed in section 112 and plated with material 120, rigid section 112 may be connected to flexible section 114. Thereafter, through hole 116 may be used as a guide to perform a laser ablation of the flexible section 114. The laser ablation is performed by directing the laser beam into and through the plated through hole 120, and onto the dielectric layer of second or flexible section 120 lying between the first section and metallic layer 116. The metallic layer 116 serves as an ablation stop layer; typical lasers used to ablate dielectrics such as polyimide will not readily ablate metals such as copper. Thus, the ablation tends to stop when the ablated hole reaches layer 116. This creates a blind hole 122 in section 114. Clearly, the goal of the ablation process is to only form hole 122 so that inner metal layer 116 is exposed. Finally, blind hole 122 may be plated in a similar fashion to that of through hole 118. This creates a connection between inner metal layer 116, blind hole 122, through hole 118, and any components electrically connected to material 120.

In one variant (depicted as assembly 210 in FIG. 3) of the present invention, a first or rigid section 212 with a preformed through hole 218 plated with material 220 may also be connected to a flexible section 214 having an inner metal layer 216. Thereafter, a blind hole 222 may also be laser ablated in section 214, so as to expose layer 216. Each of these elements is preferably similar to those discussed above in relation to assembly 110. However, rather than plating blind hole 222, a solder 224 or the like may be deposited within through hole 118 and blind hole 222. As shown in FIG. 3, this could create an electrical connection between inner metal layer 216, blind hole 122, through hole 218 and any components electrically connected to material 220. Formation of such a solder connection works best when the thickness of the dielectric layer intervening between the end of the plated material 220 and the inner metal layer 216 is relatively small. Where this approach is used, there is no need for any plating operation after formation of the blind hole. For example, a second or flexible section can be added readily to an existing first section or rigid circuit board. This is just one variation of the present inventive method and apparatus.

Clearly, the apparatus and methods of the present invention may vary as would be obvious to those of ordinary skill in the art. For example, the above discussed materials may vary, as can the particular method steps utilized to achieve the various assemblies disclosed herein. In addition, the inventive method may be utilized to create other types of structures regardless of whether the sections are rigid and flexible, as discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a multi-layer printed wiring assembly comprising the steps of:
   providing a first section including one or more layers, said first section having a plated through hole formed therethrough;
   attaching a second section to said first section, said second section having at least one dielectric layer and a metal layer; and
   laser ablating a blind hole through at least one dielectric layer of said second section to expose said metal layer, said laser ablating step being performed through said through hole of said first section.

2. The method of claim 1, further including the step of plating said blind hole.

3. The method of claim 1, further including the step of depositing solder within said blind hole and said plated through hole.

4. The method of claim 2, wherein said metal layer is electrically connected to said plated through hole.

5. The method of claim 3, wherein said metal layer is electrically connected to said plated through hole.

6. The method of claim 1, wherein said first section is a substantially rigid circuit board.

7. The method of claim 6, wherein said second section is a flexible circuit panel.

8. The method of claim 1, wherein said first section includes one or more fiber-reinforced dielectric layers and said one or more dielectric layers of said second section are unreinforced dielectric layer.

9. The method of claim 8, wherein said one or more fiber-reinforced dielectric layers include FR-4 and said unreinforced dielectric layers include polymide.

10. A method of forming a multi-layer printed wiring assembly comprising the steps of:
    providing a first section including one or more layers, said first section having a plated through hole formed therethrough;
    attaching a second section to said first section, said second section having at least one dielectric layer and a metal layer;
    laser ablating a blind hole through at least one dielectric layer of said second section to expose said metal layer, said laser ablating step being performed through said through hole of said first section; and
    plating said blind hole, such that said metal layer is electrically connected to said plated through hole.

11. The method of claim 10, wherein said first section is a substantially rigid circuit board.

12. The method of claim 11, wherein said second section is a flexible circuit panel.

13. The method of claim 10, wherein said first section includes one or more fiber-reinforced dielectric layers and said one or more dielectric layers of said second section are unreinforced dielectric layer.

14. The method of claim 13, wherein said one or more fiber-reinforced dielectric layers include FR-4 and said unreinforced dielectric layers include polymide.

15. A method of forming a multi-layer printed wiring assembly comprising the steps of:
    providing a rigid circuit board including one or more layers, said rigid circuit board having a plated through hole formed therethrough;

attaching a flexible circuit panel to said first section, said flexible circuit panel having at least one dielectric layer and a metal layer;

laser ablating a blind hole through at least one dielectric layer of said flexible circuit panel to expose said metal layer, said laser ablating step being performed through said through hole of said rigid circuit board; and plating said blind hole, such that said metal layer is electrically connected to said plated through hole.

16. The method of claim 15, wherein said rigid circuit board includes one or more fiber-reinforced dielectric layers and said one or more dielectric layers of said flexible circuit panel are unreinforced dielectric layer.

17. The method of claim 8, wherein said one or more fiber-reinforced dielectric layers include FR-4 and said unreinforced dielectric layers include polymide.

* * * * *